(12) United States Patent
Morrison

(10) Patent No.: US 6,259,151 B1
(45) Date of Patent: Jul. 10, 2001

(54) USE OF BARRIER REFRACTIVE OR ANTI-REFLECTIVE LAYER TO IMPROVE LASER TRIM CHARACTERISTICS OF THIN FILM RESISTORS

(75) Inventor: Michael J. Morrison, Malabar, FL (US)

(73) Assignee: Intersil Corporation, Palm Bay, FL (US)

( * ) Notice: Subject to any disclaimer, the term of this patent is extended or adjusted under 35 U.S.C. 154(b) by 0 days.

(21) Appl. No.: 09/358,266

(22) Filed: Jul. 21, 1999

(51) Int. Cl.[7] .................................................. H01L 29/00
(52) U.S. Cl. .......................................... 257/537; 257/380
(58) Field of Search .................................. 257/528, 536, 257/537, 380, 379, 381, 359, 358, 363; 438/238, 382, 190, 330, 384; 29/610.1

(56) References Cited

U.S. PATENT DOCUMENTS

| | | |
|---|---|---|
| 4,198,744 | 4/1980 | Nicolay . |
| 4,665,295 | 5/1987 | McDavid . |
| 4,682,204 | 7/1987 | Shiozaki et al. . |
| 4,826,785 | 5/1989 | McClure et al. . |
| 4,853,758 | 8/1989 | Fischer . |
| 4,935,801 | 6/1990 | McClure et al. . |
| 5,021,867 * | 6/1991 | Przybysz .............................. 357/71 |
| 5,260,597 | 11/1993 | Usuda et al. . |
| 5,279,984 | 1/1994 | Kinoshita et al. . |
| 5,554,873 | 9/1996 | Erjeljac et al. . |
| 5,608,257 | 3/1997 | Lee et al. . |
| 6,090,678 * | 7/2000 | Maghsoudnia ...................... 438/382 |

OTHER PUBLICATIONS

Tadanori Yamaguchi, Sudarsan Uppili, June S. Lee, Galen H. Kawamoto, Taner Dosluoglu and Shaun Simpkins, "Process and Device Characterization for a 30–GHz ft Submicrometer Double Poly–Si Bipolar Technology Using BF–2–Implanted Base with Rapid Thermal (contd) Process", IEEE Transactions on Electron Devices, vol. 40, No. 8, Aug. 1993.

* cited by examiner

Primary Examiner—Steven Loke
Assistant Examiner—Douglas W. Owens
(74) Attorney, Agent, or Firm—Jaeckle Fleischmann & Mugel, LLP

(57) ABSTRACT

A precision resistor of NiCr or SiCr has a refractive and thermal barrier layer beneath the resistor. The refractive barrier is a layer of refractory metal. The refractory metal prevents the incident laser beam of a laser trimmer penetrating lower layers of the device. Unwanted reflections and refractions caused by lower layers are avoided. The reflective barrier layer is a material selected from the group consisting of tungsten, titanium, molybdenum, $TiSi_2^{13,14}$, $CoSi_2^{15}$, $MoSi_2$, $TaSi_2$ and $WSi_2$.

7 Claims, 1 Drawing Sheet

USE OF BARRIER REFRACTIVE OR ANTI-REFLECTIVE LAYER TO IMPROVE LASER TRIM CHARACTERISTICS OF THIN FILM RESISTORS

FIELD OF INVENTION

The invention addresses the general problem of thin film microcircuit resistor fabrication and adjustment, and the specific problem of improving laser trimming to achieve circuit parametric values for such resistors.

DISCUSSION OF PRIOR ART

The technique of laser trimming to bring thin film resistors to their circuit parametric values is well-known in the art. See Elshabini-Riad and Barlow, sections 5.6.4 through 5.6.7, Thin Film Technology Handbook, McGraw-Hill (1998). Current practice requires the tight process control of the thickness and optical properties of layers of the semiconductor wafer that lie below the thin film resistor layer, in an effort to avoid irregularities caused by non-uniform laser energy beam interference.

Consider the structure of a typical precision resistor as shown in FIG. 1. It has a silicon handle substrate 90 that is oxide bonded 80 to a silicon device substrate 70. A thermal oxide 60 is grown on the device surface. Layers of deposited dielectric materials 50 cover the thermal oxide 60. A precision trimmable resistor material 40 of NiCr or SiCr is deposited on the field dielectric layers 50. Another oxide layer 30 is deposited on resistor layer 40. The top oxide layer 30 is planarized and coated with a passivation nitride layer 20. Incident laser light 10 passes through all the layers until it is finally reflected or absorbed by the handle substrate 90. The reflections are shown by the arrows 55, 65, 75 and 85. Note that the path 10 of the laser beam is altered as it passes through the different materials that form the device.

After the incident laser beam passes through the NiCr or SiCr resistor, the beam encounters a number of other layers. The layers and the interface of one of the layers with another layer have different indices of refraction. As such, the laser beam is deflected from its incident path in accordance with Snell's law: the ratio of the sine of the angle of incidence to the sine of the angle of refraction equal the ratio of the refractive indices of the materials. The laser beam is reflected by one or more of the lower layers onto the reverse surface of the resistor material. The reflected laser may be strong enough to chemically alter some of the resistor material and thereby alter the resistance in a manner not desired.

Thus, the quality of laser trim of precision thin film resistors can vary due to constructive and destructive interference of the laser's beam energy with layers above and below the resistor material. Trim quality is affected by optical properties and thickness of layers above and below the NiCr resistor. This effect has been confirmed both empirically and with computer simulation of optical effects. Consequently, many production wafer lots may be delayed due to poor laser trim. Laser trim quality is subjectively evaluated and some wafer lots are scrapped as a result of poor laser kerf quality, which can vary across a wafer or even across a single die. As a result of this problem, it may take an operator or an automatic laser trimming machine several cycles of operation, measurement and retrimming in order to trim the resistor to the precise resistance required by the integrated or thin film circuit.

U.S. Pat. No. 5,608,257 relates to laser cutting of a fusible link. It acknowledges the problem posed by a complex of underlying reflective and refractive layers. However it provides no solution to the problem posed by precision resistors.

SUMMARY

The invention inserts a refractory material which acts as an optical barrier below the thin film resistor layer, and a dielectric film separating the refractory material from the thin film resistor in order to preserve the resistor's electrical behavior in the circuit. These layers eliminate the interaction of the laser trim with the lower layers of the semiconductor wafer including the silicon and dielectric layers, eliminating the need to control tightly the thickness and optical properties of these layers.

The proposed invention requires the addition of a refractive layer, and a dielectric layer, both below the laser-trimmed resistor films. This innovation ensures quality trim by eliminating laser energy interaction with device silicon and bond oxide layers below the barrier refractive layer. Since such device silicon and bond oxide lower layers can no longer affect the local intensity of the laser energy, the uniformity of laser trim and kerf is improved.

DETAILED DESCRIPTION OF INVENTION

Figure 2:
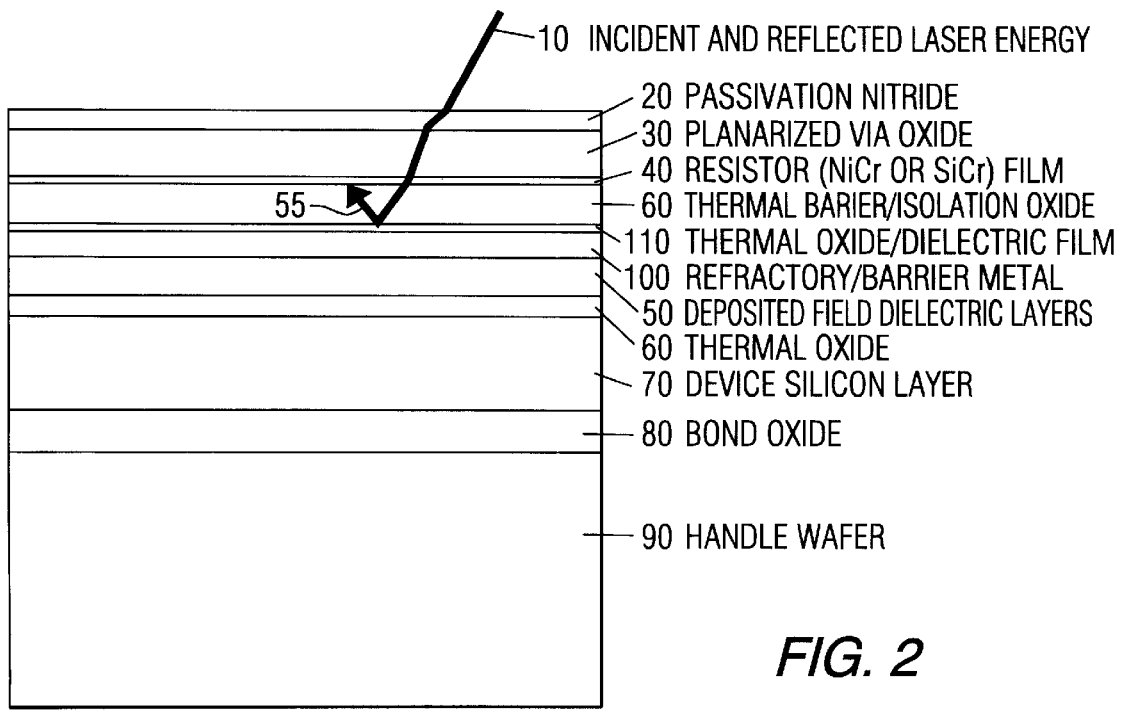
FIG. 2 is an overview of the proposed system, showing the use of the refractory/barrier metal to eliminate reflective laser energy during resistor trim.

Refer to FIG. 2. The integrated circuit incorporates a device silicon layer 70 which includes one or more semiconductor devices or an integrated circuit. Such devices and integrated circuits and their respective fabrications are conventional. The device substrate 70 may or may not have a handle substrate 90 that is oxide bonded 80 to the backside of the device substrate 70. After formation of the devices or integrated circuit, the devices or integrated circuit are covered with a suitable insulators such as deposited or thermal oxides 50,60. These layers are covered by the refractory/barrier layer 100. In a device made in accordance with the invention such insulator layers are required to separate the devices from refractory barrier metal 100 which may be conductive. The layer 100 is deposited over the substrate and comprises a refractory material such as tungsten, titanium, molybdenum and refractory suicides such as $TiSi_2$[13,14], $CoSi_2$[15], $MoSi_2$, $TaSi_2$ and $WSi_2$. A refractory material is desired to withstand the heat of the incident laser beam. A barrier oxide layer 110 is deposited on top of the refractory layer 100. The barrier layer 110 acts as both an electrical and thermal insulator to protect superior layers from excess heat generated by the incident laser on the reflective layer 100. That layer and the superior layers are substantially the same as conventional laser trim resistor layers discussed above.

Figure 1:
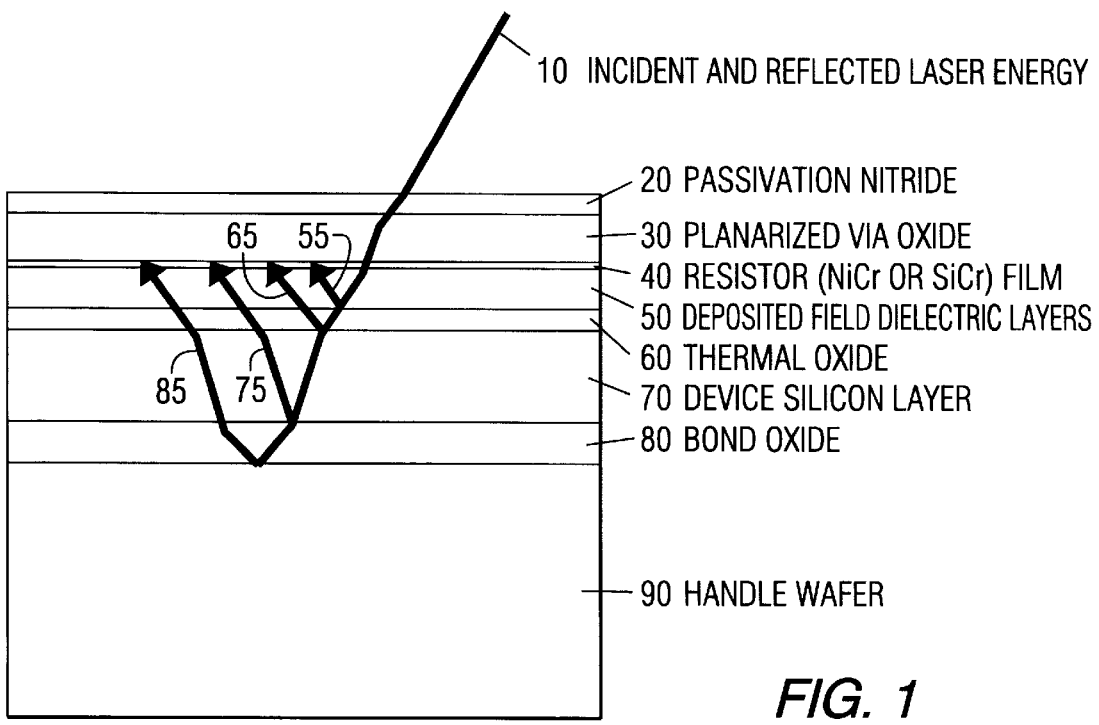
FIG. 1 is an overview of the current system and the manner in which laser energy used for resistor trim penetrates and is reflected by the layers of material in the semiconductor product.

Refer to FIG. 1. During semiconductor circuit design, precision trimmable resistors are incorporated into circuits as defined areas of a thin film of resistive material 40 such as NiCr or SiCr. Film 40 typically lies above bond oxide layer 80, device silicon layers 70, thermal oxide layer 60, and deposited field dielectric layers 50. To trim a resistor in film 40 to its required circuit parameter values, focused laser energy 10 is applied to chemically alter resistive material from film 40 in one or more patterns well known in the art. The laser effectively encases, mixes or otherwise combines the oxides on either side of the resistor material with the resistor material that is struck by the laser. The resistor becomes electrically discontinuous at that location. Some portion of laser energy 10 normally penetrates layers 50, 60, 70 and 80, and each of layers 50, 60, 70 and 80 reflects some portion of the incident energy upward toward resistor film 40. The wavelengths of incident laser energy 10 are sharply defined and highly coherent; consequently any variations in the thickness of any of layers 50, 60, 70 and 80 may result in significant interference-based variations in reflected trim laser energy 55, 65, 75 and 85. Such variations may in turn cause uneven kerf in the trim process, resulting in unreliable trim effects on resistor electrical behavior.

Refer to FIG. 2. The invention incorporates a refractory layer 100 and a thermal oxide/dielectric film 110 below each resistor in layer 40 to absorb laser energy which would otherwise penetrate to device silicon layers 70 and bond oxide layer 80 below the resistor. Layer 100 lies below layer 110, and its etch profile is sized beneath each projected resistor in a size sufficiently large to insure acceptable protection of the laser trim from stray laser energy that might otherwise escape into deeper layers 50, 60, 70 or 80. The invention tailors the thicknesses of layer 110 so as to minimize variations in reflections 55. Once resistor layer 40 is in place fabrication is completed by the application of normal vias in layers 30 and passivation nitride layer 20.

In a typical application a laser beam of 1.06 microns in wavelength had a wavelength of 1.06/1.45 microns or 7310 angstroms in oxide and 1.06/3.54 or 2994 angstroms in silicon. As the light is reflected off the reflective layer, constructive and destructive interference is created within that layer with a period of half of the wavelength in that material, or 1497 angstroms in silicon and 3655 angstroms in oxide. The amount of light escaping that layer also goes through minima and maxima, which is eventually detected as reflectivity of the NiCr layer. The reflective layer is typically a refractory material such as tungsten, titanium, molybdenum, $TiSi_2^{13,14}$, $CoSi_2^{15}$, $MoSi_2$, $TaSi_2$ and $WSi_2$. Since the refractory material is conductive, it is electrically insulated from the resistor layer by a suitable, transparent insulating layer such as silicon dioxide or silicon nitride.

The consequence of the use of the invention's process and design is the elimination of resistor-driven thickness control constraints on device silicon and dielectric layers, and significantly increased assurance that laser-trimmed thin film resistors operate within their planned circuit parametric values.

CONCLUSION, RAMIFICATIONS, AND SCOPE OF INVENTION

The description and summary above, together with the figures, present the invention's benefits in reducing inaccuracies in behavior of thin film resistors when laser trim is used. Apart from the refractory/barrier metal layer, the thermal barrier/isolation oxide layer and the resistor layer, the number and character of layers of insulating, conducting and semiconducting material may vary without affecting the operation and structure of this invention. Further, the invention's benefits apply across all forms of circuit produced in VLSI semiconductor fabrication, wherever thin film resistors are used and trimmed using laser methods. Finally, any constraints on device silicon and dielectric layer thickness imposed by the laser trim process for thin film resistors are relieved by the invention.

Although the description, embodiments and illustrative material above contain many specificities, these specificities should not be construed as limiting the scope of the invention but as merely providing illustrations and examples of some of the preferred embodiments of the invention.

Thus the scope of the invention should be determined by the appended claims and their legal equivalents, rather than by the examples given above.

What is claimed is:

1. An integrated circuit with a precision trimmable resistor comprising:
   a semiconductor device substrate;
   one or more devices or an integrated circuit formed in the substrate;
   an opaque reflective layer disposed over the substrate for reflecting a trimming laser beam;
   a trimmable resistor layer disposed over the reflective layer; and
   a transparent insulating layer disposed over the substrate between the reflective layer and the trimmable resistor layer.

2. The integrated circuit of claim 1 wherein the reflective layer comprises refractory material.

3. The integrated circuit of claim 2 wherein the refractory material comprises a material selected from the group consisting of tungsten, titanium, molybdenum, $TiSi_2^{13,14}$, $CoSi_2^{15}$, $MoSi_2$, $TaSi_2$ and $WSi_2$.

4. The integrated circuit of claim 1 wherein the insulating layer is silicon dioxide or silicon nitride.

5. The integrated circuit of claim 1 wherein the device substrate is oxide bonded to a handle substrate.

6. An integrated circuit with a trimmable precision resistor layer comprising:
   a handle substrate;
   a bond oxide layer for bonding the handle wafer to a device substrate;
   a device substrate;
   a refractory, reflective barrier metal layer over the device substrate for reflecting incident laser light;
   a thermal barrier on the refractory, reflective barrier metal layer for insulating superior layers from heat generated when laser light strikes the refractory, reflective metal layer;
   a laser trimmable precision resistor layer over the thermal barrier layer;
   a planarized oxide layer over the laser trimmable precision resistor layer; and
   a passivation layer over the planarized oxide layer.

7. The integrated circuit of claim 6 wherein the reflective barrier is a material selected from the group consisting of tungsten, titanium, molybdenum, $TiSi_2^{13,14}$, $CoSi_2^{15}$, $MoSi_2$, $TaSi_2$ and $WSi_2$.

* * * * *